(12) United States Patent
Yu et al.

(10) Patent No.: US 9,478,622 B2
(45) Date of Patent: Oct. 25, 2016

(54) WRAP-AROUND CONTACT FOR FINFET

(71) Applicant: GLOBALFOUNDRIES Inc., Grand Cayman (KY)

(72) Inventors: Hong Yu, Rexford, NY (US); Jinping Liu, Ballstone Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/849,335

(22) Filed: Sep. 9, 2015

(65) Prior Publication Data

US 2015/0380502 A1    Dec. 31, 2015

Related U.S. Application Data

(63) Continuation of application No. 14/156,745, filed on Jan. 16, 2014, now Pat. No. 9,159,794.

(51) Int. Cl.
| | | |
|---|---|---|
| H01L 29/417 | (2006.01) | |
| H01L 29/40 | (2006.01) | |
| H01L 21/768 | (2006.01) | |
| H01L 29/66 | (2006.01) | |
| H01L 29/49 | (2006.01) | |
| H01L 21/311 | (2006.01) | |
| H01L 29/78 | (2006.01) | |
| H01L 21/02 | (2006.01) | |

(52) U.S. Cl.
CPC ... *H01L 29/41791* (2013.01); *H01L 21/31116* (2013.01); *H01L 21/76802* (2013.01); *H01L 21/76826* (2013.01); *H01L 21/76829* (2013.01); *H01L 21/76831* (2013.01); *H01L 21/76897* (2013.01); *H01L 29/401* (2013.01); *H01L 29/495* (2013.01); *H01L 29/66795* (2013.01); *H01L 29/785* (2013.01); *H01L 21/0234* (2013.01); *H01L 21/02326* (2013.01); *H01L 2029/7858* (2013.01)

(58) Field of Classification Search
None
See application file for complete search history.

(56) References Cited

U.S. PATENT DOCUMENTS

| | | | |
|---|---|---|---|
| 7,074,662 B2* | 7/2006 | Lee | H01L 21/84 257/E21.442 |
| 7,262,086 B2 | 8/2007 | Yeo et al. | |
| 7,385,237 B2* | 6/2008 | Lee | H01L 29/66795 257/213 |
| 7,795,669 B2 | 9/2010 | Georgakos et al. | |
| 7,910,994 B2* | 3/2011 | Yu | H01L 29/41791 257/347 |
| 8,377,779 B1* | 2/2013 | Wang | H01L 29/66795 257/E21.421 |
| 8,975,144 B2* | 3/2015 | Kwok | H01L 29/045 438/294 |
| 9,276,116 B2* | 3/2016 | Maeda | H01L 29/785 |
| 2013/0187228 A1* | 7/2013 | Xie | H01L 29/785 257/347 |
| 2014/0273365 A1* | 9/2014 | Wei | H01L 21/823821 438/199 |
| 2014/0374827 A1* | 12/2014 | Suh | H01L 29/785 257/347 |
| 2015/0035023 A1* | 2/2015 | Kim | H01L 29/785 257/288 |
| 2015/0099340 A1* | 4/2015 | Yu | H01L 29/66795 438/285 |

* cited by examiner

*Primary Examiner* — Andres Munoz
(74) *Attorney, Agent, or Firm* — Williams Morgan, P.C.

(57) ABSTRACT

Embodiments of the present invention provide an improved contact formation process for a finFET. Epitaxial semiconductor regions are formed on the fins. A contact etch stop layer (CESL) is deposited on the epitaxial regions. A nitride-oxide conversion process converts a portion of the nitride CESL into oxide. The oxide-converted portions are removed using a selective etch process, and a fill metal is deposited which is in direct physical contact with the epitaxial regions. Damage, such as gouging, of the epitaxial regions is minimized during this process, resulting in an improved contact for finFETs.

18 Claims, 11 Drawing Sheets

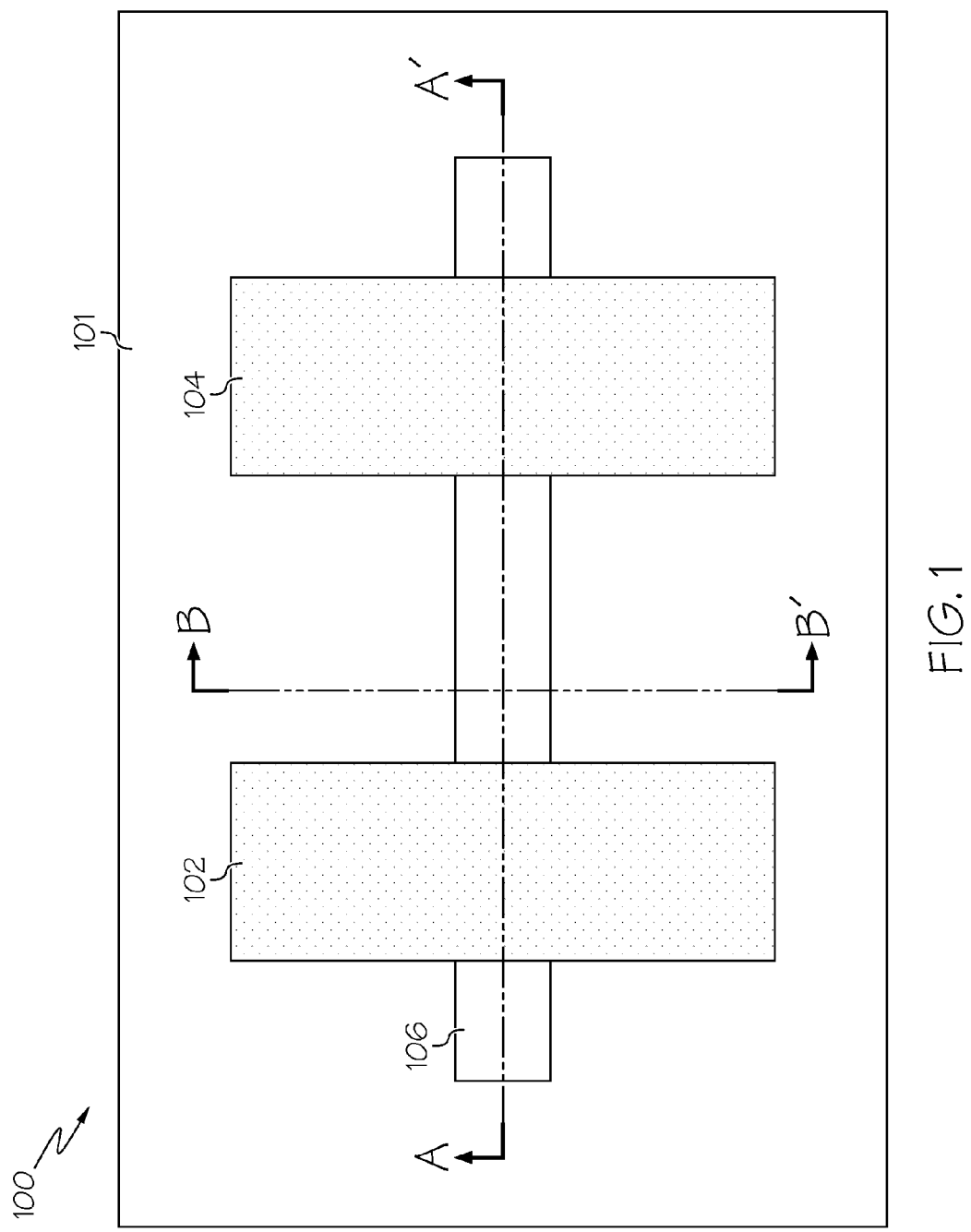

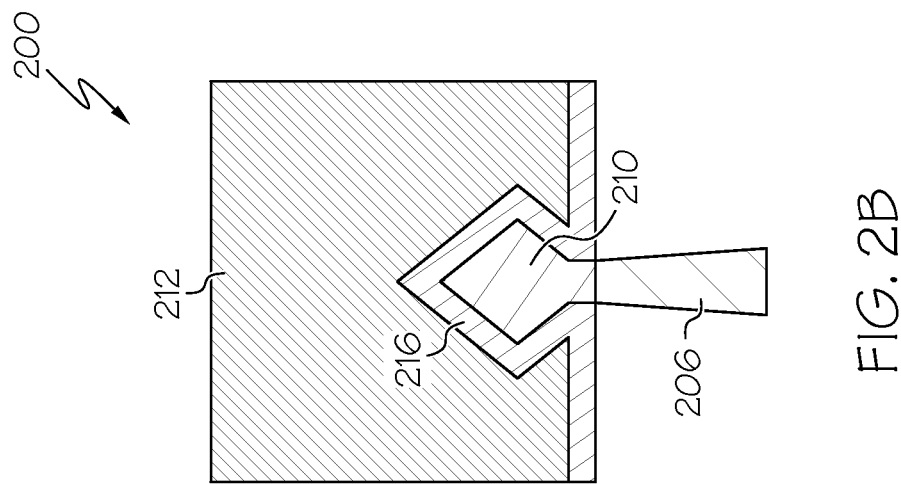
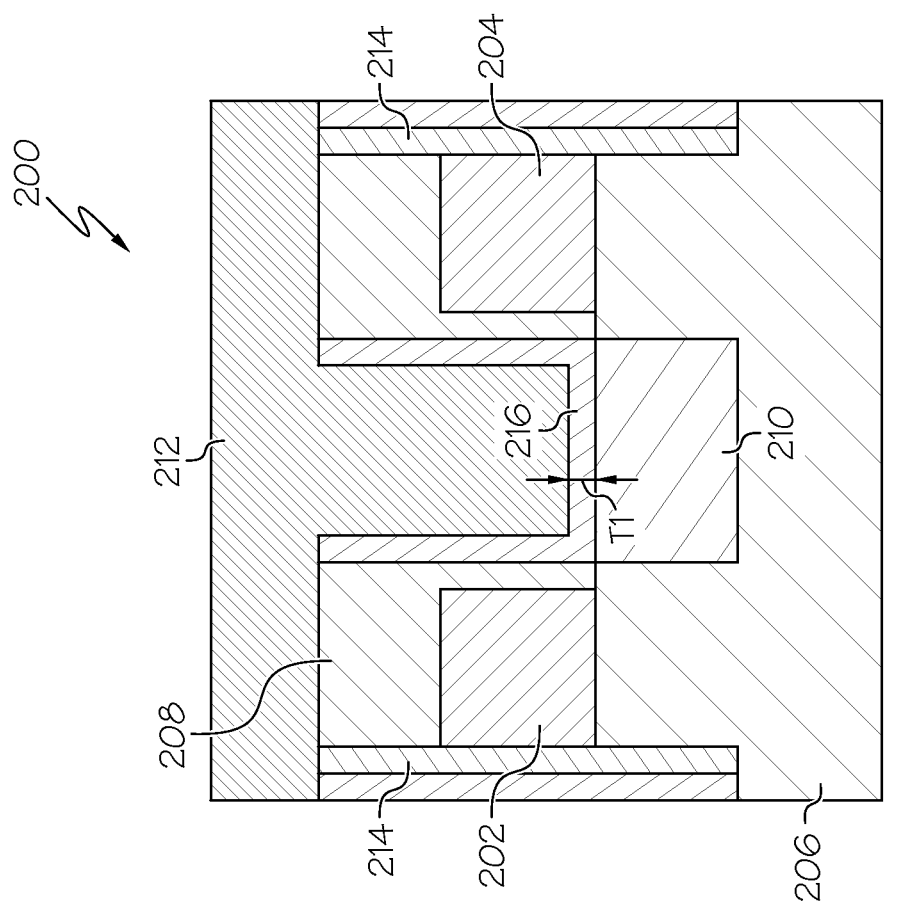

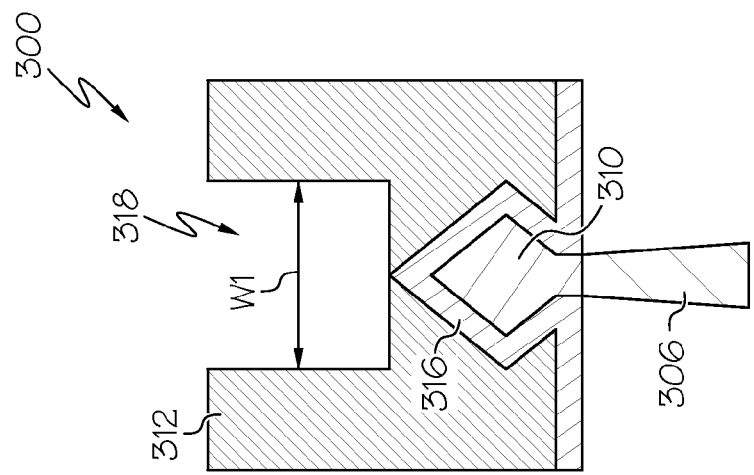
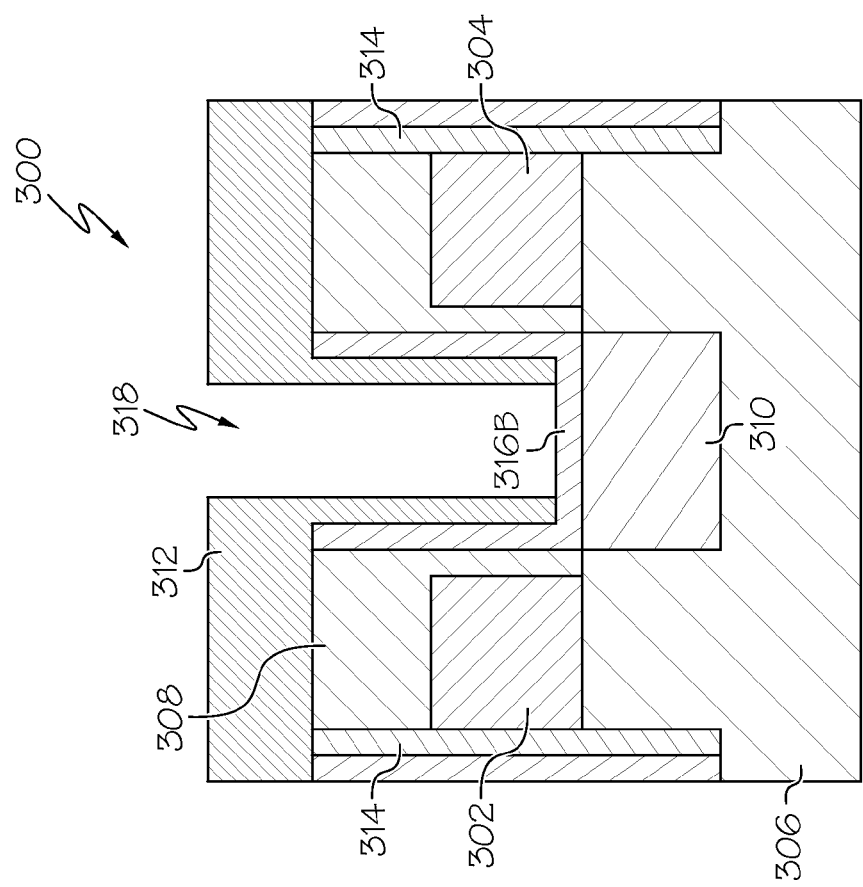
FIG. 3B
FIG. 3A

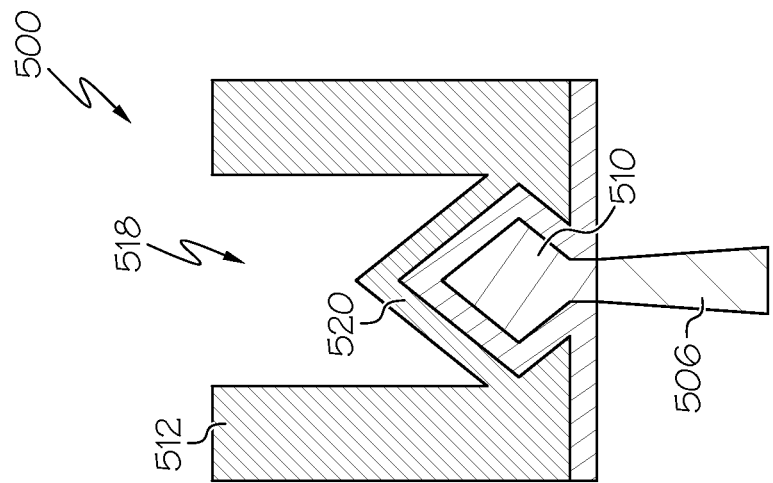
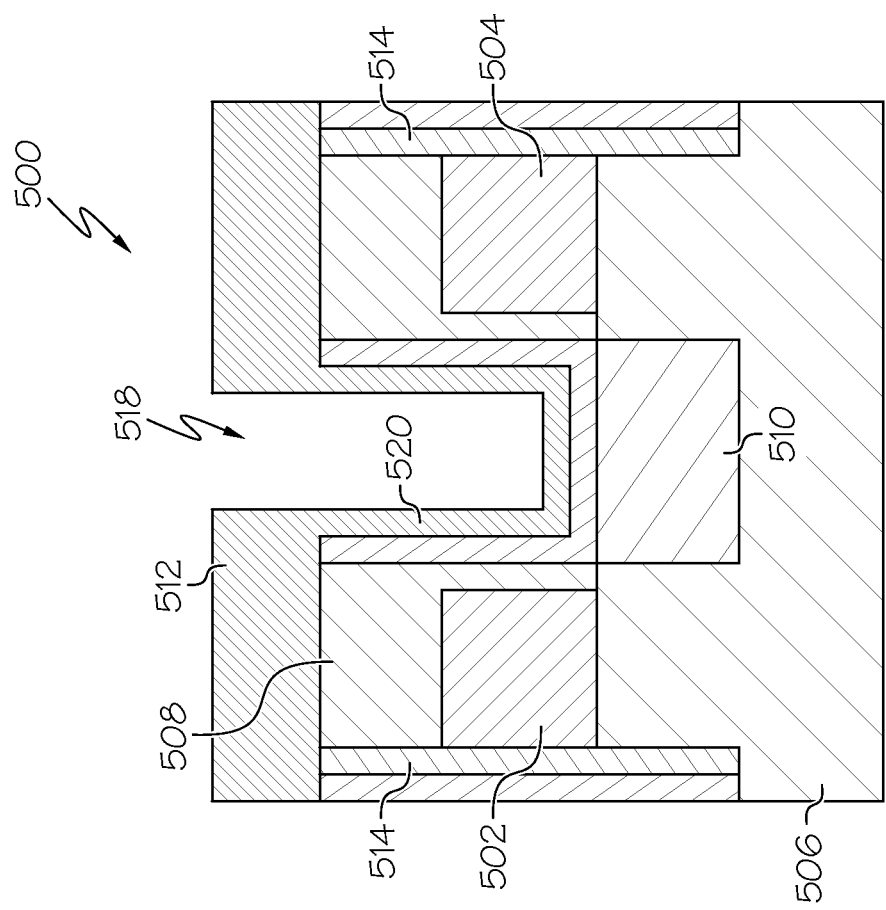

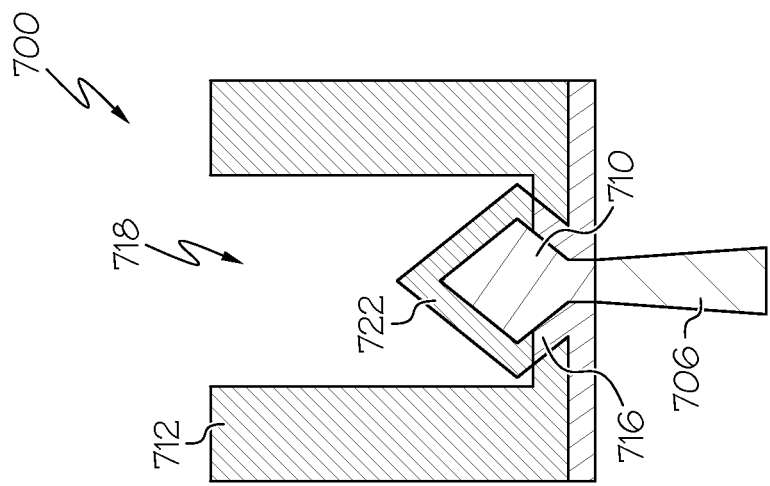
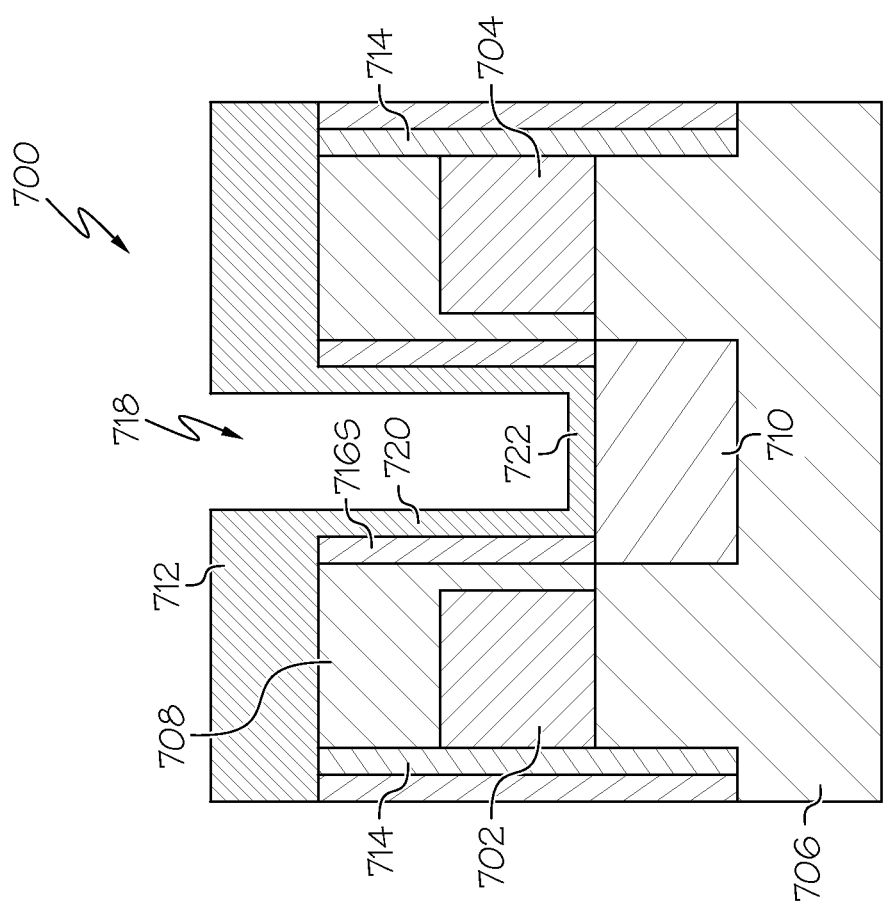
FIG. 7B
FIG. 7A

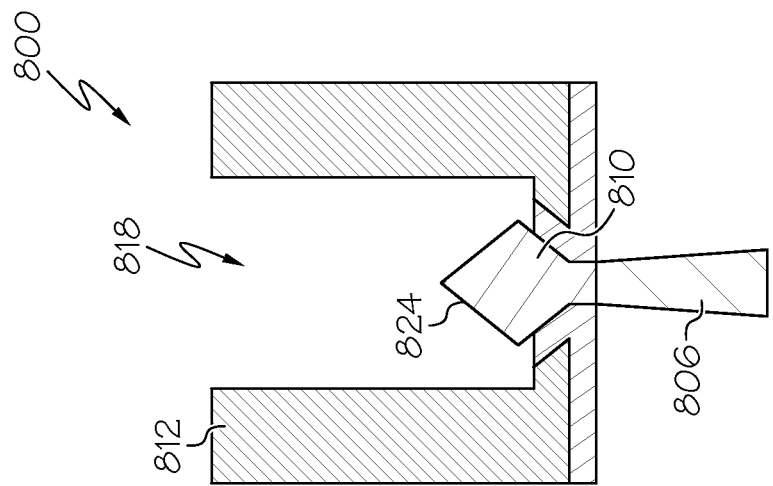
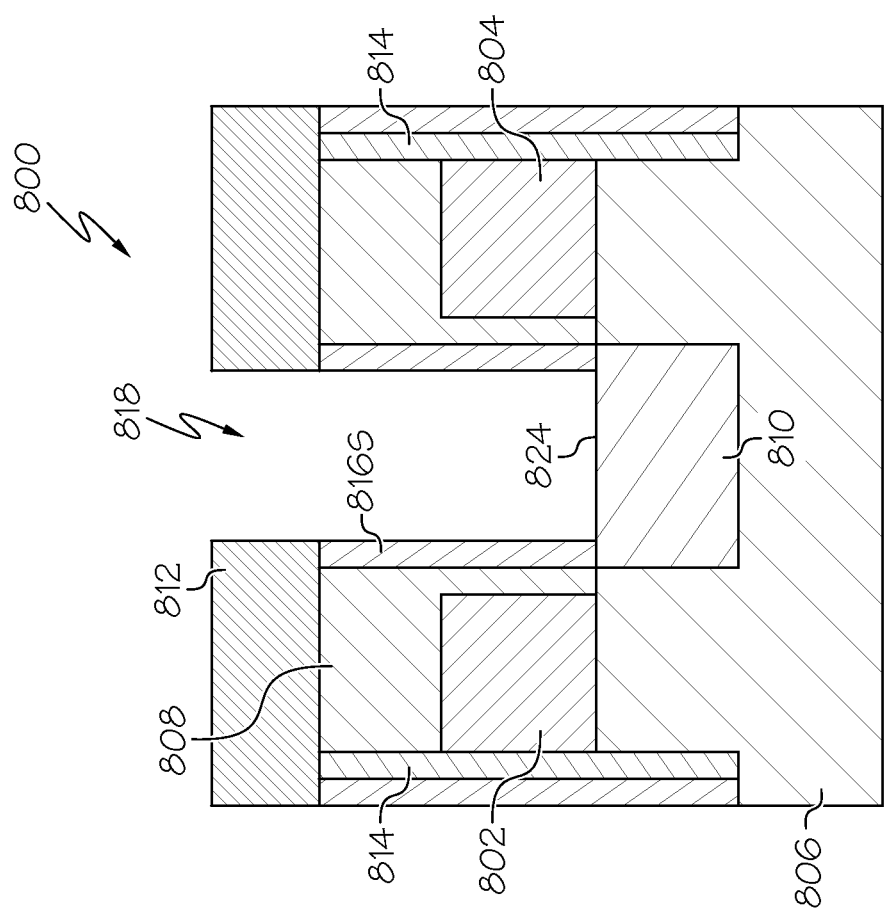
FIG. 8B
FIG. 8A

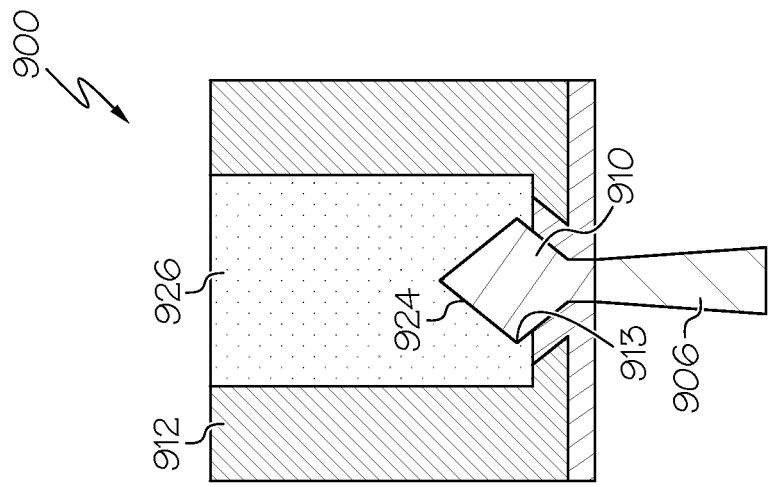
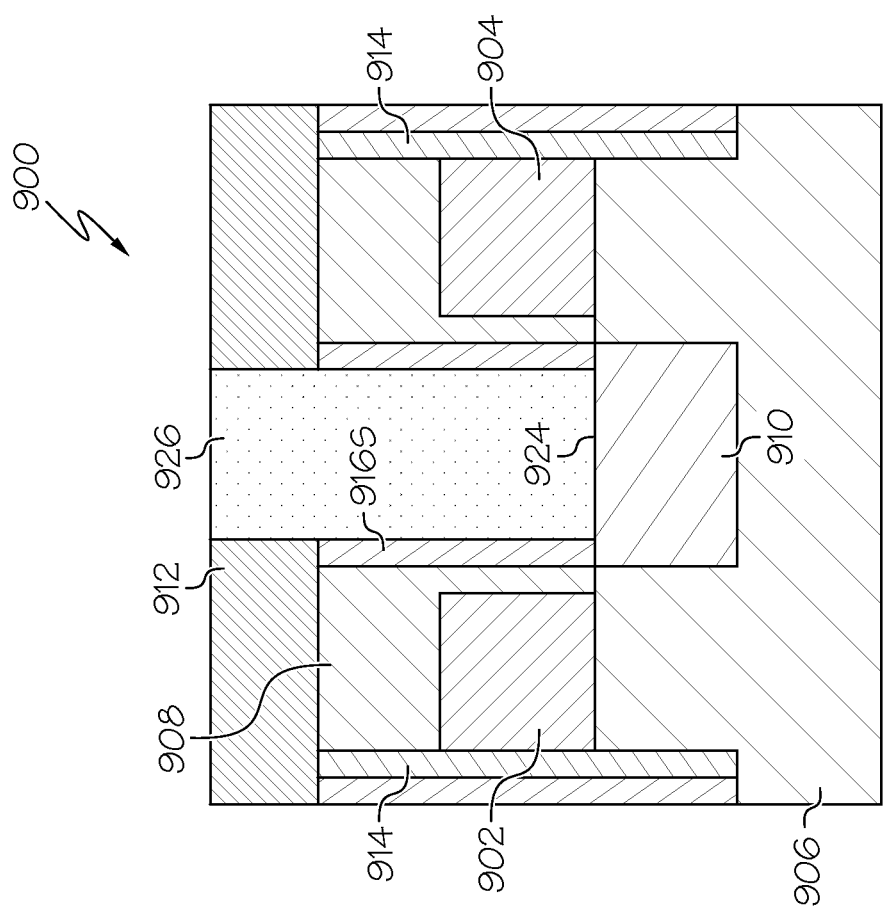
FIG. 9A
FIG. 9B

WRAP-AROUND CONTACT FOR FINFET

CROSS-REFERENCE TO RELATED APPLICATIONS

This application is a Continuation of U.S. patent application Ser. No. 14/156,745, filed Jan. 16, 2014, which issued on Oct. 13, 2015 as U.S. Pat. No. 9,159,794.

FIELD OF THE INVENTION

The present invention relates generally to semiconductor fabrication and, more particularly, to methods for forming contacts on finFET devices.

BACKGROUND

As integrated circuits continue to scale downward in size, the finFET (fin field effect transistor) is becoming an attractive device for use in semiconductor integrated circuits (ICs). In a finFET, the channel is formed by a semiconductor vertical fin, and a gate electrode is located and wrapped around the fin. With finFETs, as with other transistor types, the contacts that connect the source, drain, and gate of the transistor are an important factor in the production of reliable integrated circuits with desired performance characteristics. It is therefore desirable to have improvements in the fabrication of finFET transistors to improve the quality of the transistor contacts.

SUMMARY

Embodiments of the present invention provide an improved contact formation process for a finFET. Epitaxial semiconductor regions are formed on the fins. A contact etch stop layer (CESL) is deposited on the epitaxial regions. A nitride-oxide conversion process converts a portion of the nitride CESL into oxide. The oxide-converted portions are removed using a selective etch process, and a fill metal is deposited which is in direct physical contact with the epitaxial regions. Damage, such as gouging, of the epitaxial regions is minimized during this process, resulting in an improved contact for finFETs.

In a first aspect, embodiments of the present invention provide a method of forming a semiconductor structure comprising: forming a semiconductor fin on a semiconductor substrate; forming an epitaxial semiconductor region disposed on the semiconductor fin; forming a nitride contact etch stop layer on the semiconductor fin; depositing a blanket oxide layer on the semiconductor structure; performing a first anisotropic etch on the blanket oxide layer over the semiconductor fin to form a cavity; performing a first isotropic etch on the blanket oxide layer over the semiconductor fin; depositing a conformal oxide layer on the nitride contact etch stop layer; performing a second anisotropic etch on the blanket oxide layer over the semiconductor fin; performing a nitride-oxide conversion process; performing a second isotropic etch on the conformal oxide layer; and depositing a fill metal in the cavity.

In a second aspect, embodiments of the present invention provide a method of forming a semiconductor structure comprising: forming a semiconductor fin on a semiconductor substrate; forming an epitaxial semiconductor region disposed on the semiconductor fin; forming a contact etch stop layer on the semiconductor fin; depositing a blanket oxide layer on the semiconductor structure; performing a first anisotropic etch on the blanket oxide layer over the semiconductor fin to form a cavity; performing a first isotropic etch on the blanket oxide layer over the semiconductor fin; depositing a conformal oxide layer on the contact etch stop layer; performing a second anisotropic etch on the blanket oxide layer over the semiconductor fin; performing a microwave-based oxidation process on the contact etch stop layer; performing a second isotropic etch on the conformal oxide layer; and depositing a fill metal in the cavity.

In a third aspect, embodiments of the present invention provide a method of forming a semiconductor structure comprising: forming a semiconductor fin on a semiconductor substrate; forming an epitaxial semiconductor region disposed on the semiconductor fin; forming a nitride contact etch stop layer on the semiconductor fin; depositing a blanket oxide layer on the semiconductor structure; performing a first reactive ion etch on the blanket oxide layer over the semiconductor fin to form a cavity; performing a first SiCoNi etch on the blanket oxide layer over the semiconductor fin; depositing a conformal oxide layer on the nitride contact etch stop layer, wherein the conformal oxide layer has a thickness ranging from about 5 nanometers to about 10 nanometers; performing a second reactive ion etch on the blanket oxide layer over the semiconductor fin; performing a microwave-based oxidation process on the nitride contact etch stop layer; performing a second SiCoNi etch on the conformal oxide layer; and depositing a fill metal in the cavity.

BRIEF DESCRIPTION OF THE DRAWINGS

The accompanying drawings, which are incorporated in and constitute a part of this specification, illustrate several embodiments of the present teachings and, together with the description, serve to explain the principles of the present teachings.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 4B:
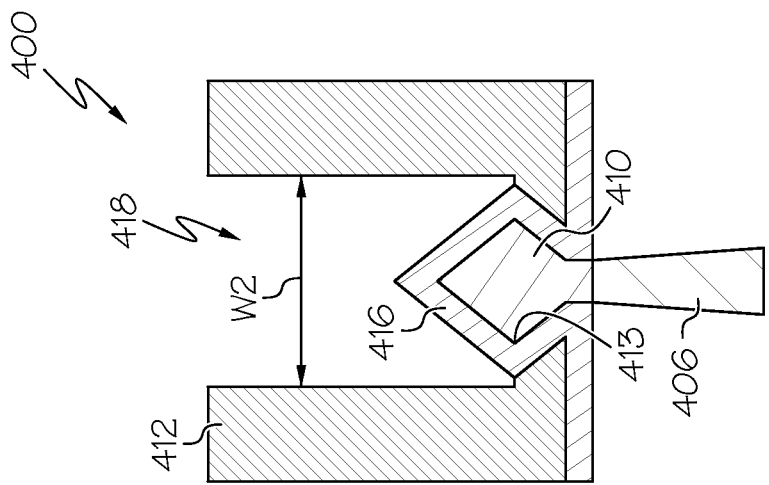

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1 is a top-down view of a semiconductor structure in accordance with embodiments of the present invention.

FIGS. 2A and 2B show views of a semiconductor structure at a starting point for embodiments of the present invention.

FIGS. 3A and 3B show views of a semiconductor structure after a subsequent process step of performing a first anisotropic etch.

Figure 4A:
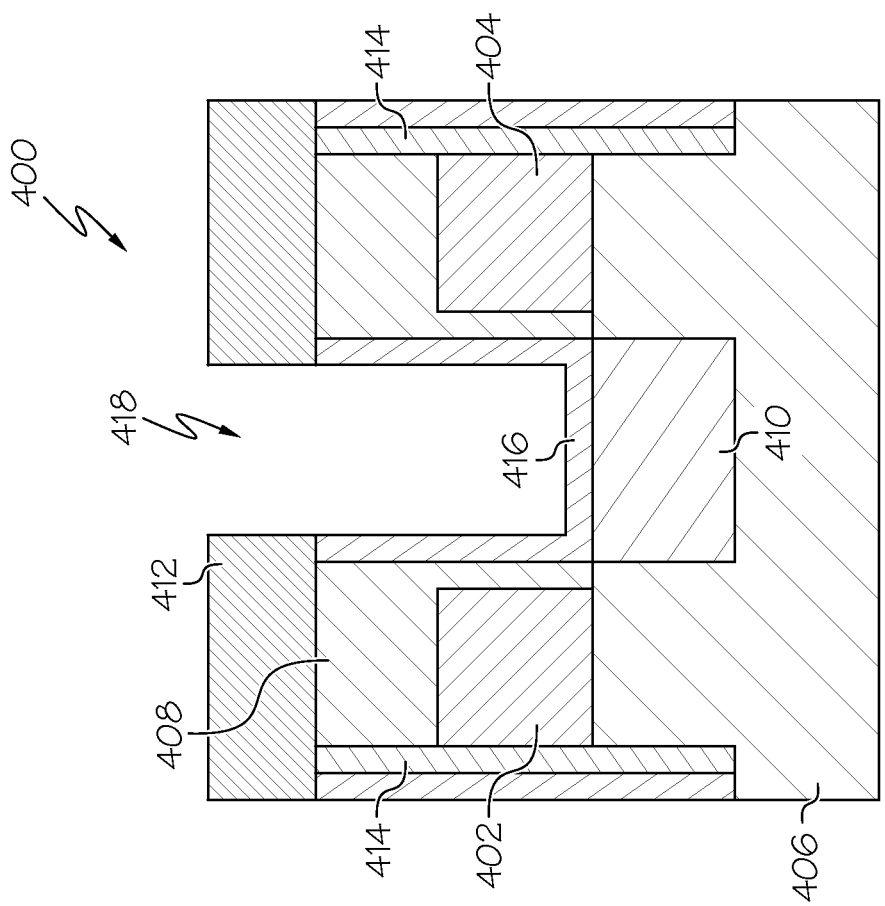

FIGS. 4A and 4B show views of a semiconductor structure after a subsequent process step of performing a first isotropic etch.

FIGS. 5A and 5B show views of a semiconductor structure after a subsequent process step of depositing a conformal oxide layer.

Figure 6B:
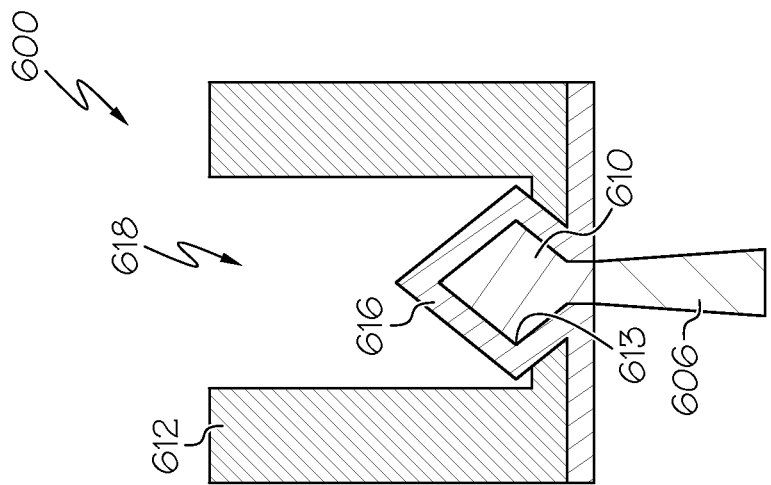
Figure 6A:
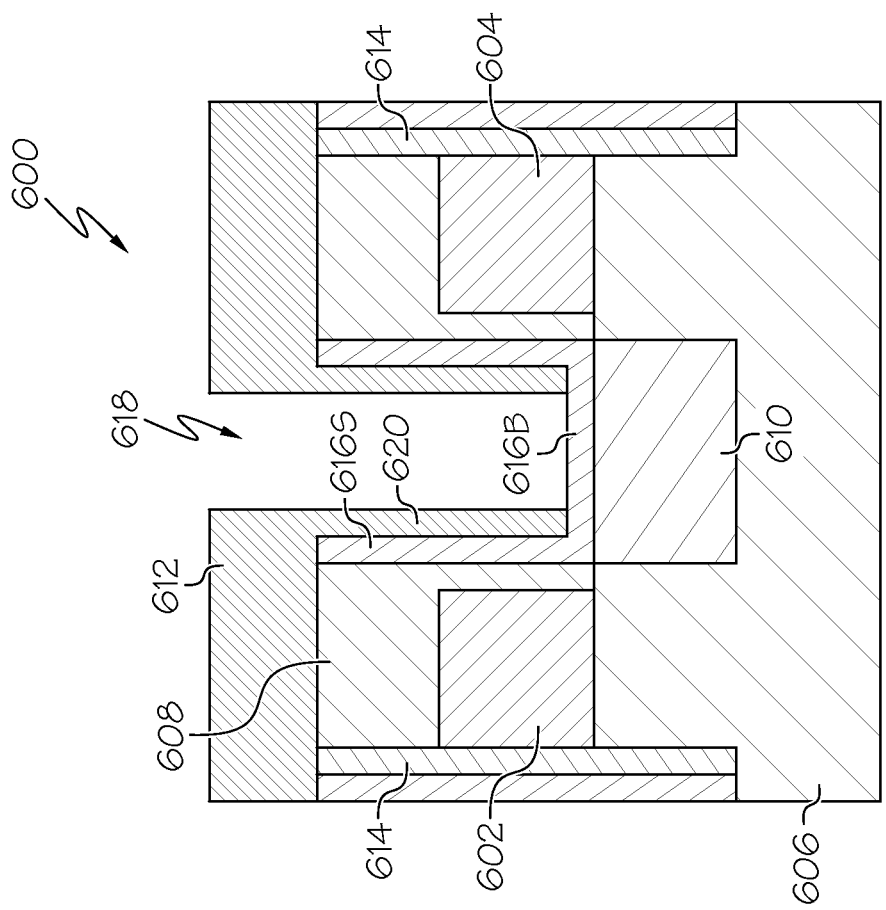

FIGS. 6A and 6B show views of a semiconductor structure after a subsequent process step of performing a second anisotropic etch.

FIGS. 7A and 7B show views of a semiconductor structure after a subsequent process step of performing a nitride to oxide conversion.

FIGS. 8A and 8B show views of a semiconductor structure after a subsequent process step of performing a second isotropic etch.

FIGS. 9A and 9B show views of a semiconductor structure after a subsequent process step of depositing a contact metal.

Figure 10:
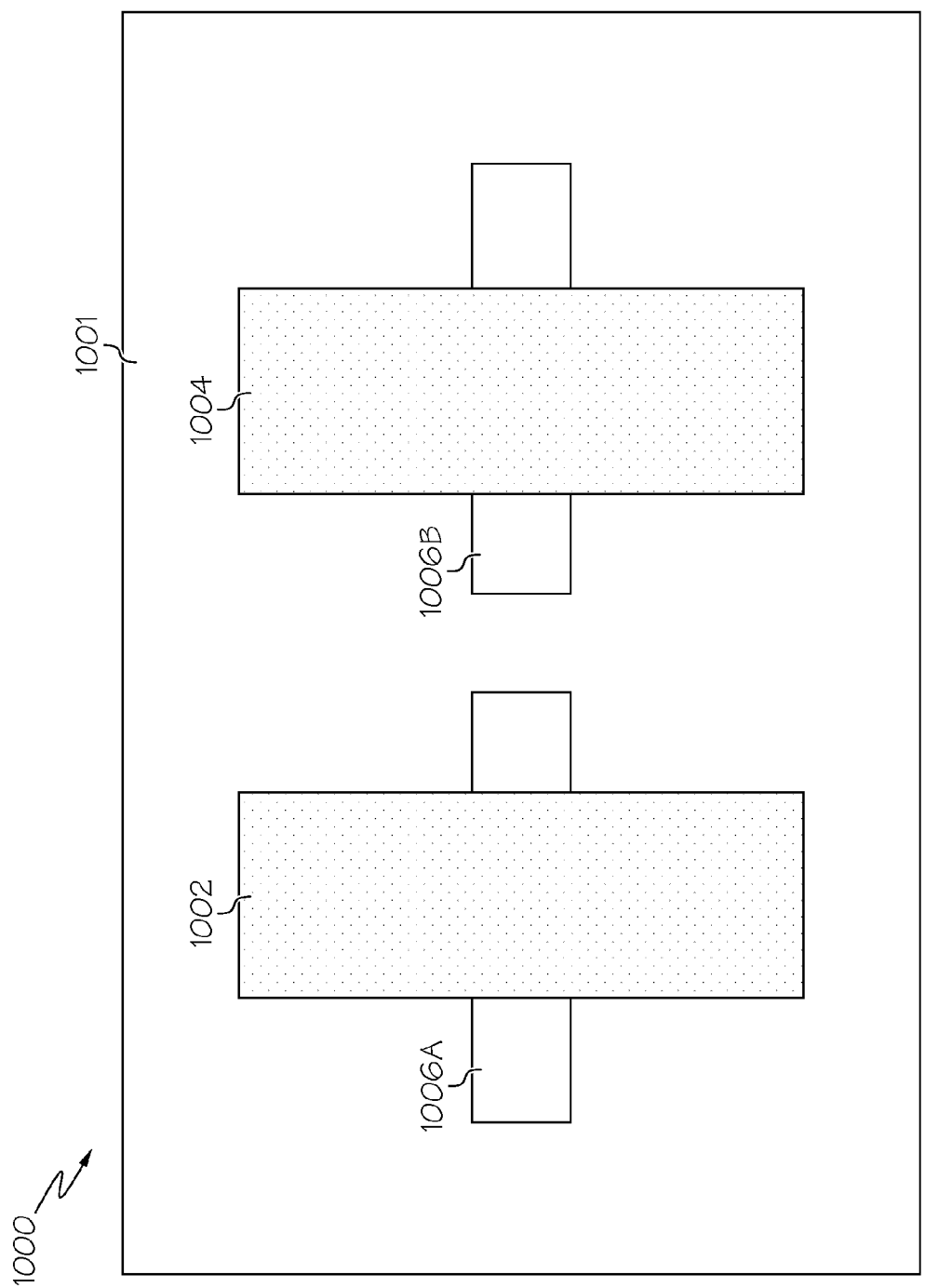

FIG. 10 shows a top-down view of a semiconductor structure in accordance with embodiments of the present invention after a subsequent process step of performing a fin cut.

Figure 11:
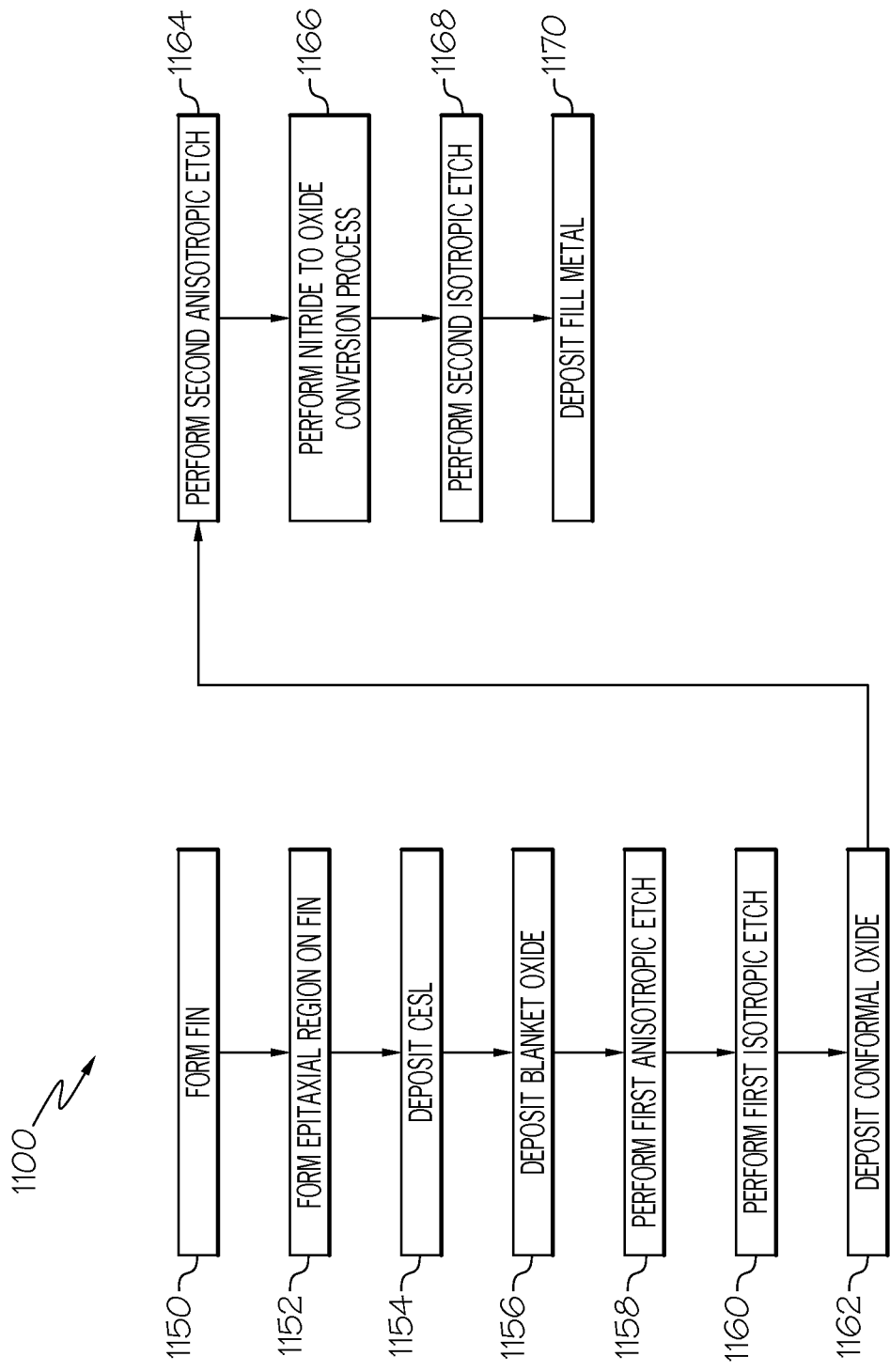

FIG. 11 is a flowchart indicating process steps for embodiments of the present invention.

DETAILED DESCRIPTION

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g., a second layer), wherein intervening elements, such as an interface structure (e.g., interface layer), may be present between the first element and the second element.

FIG. 1 is a top-down view of a semiconductor structure 100 in accordance with embodiments of the present invention. A semiconductor fin 106 is formed on a semiconductor substrate 101. A plurality of gates (102 and 104) are deposited on the semiconductor substrate 101, and are disposed over the fin 106. In some embodiments, the semiconductor substrate 101 may be a bulk silicon substrate, such as a silicon wafer. In other embodiments, the semiconductor substrate 101 may be a silicon-on-insulator (SOI) substrate. The gates 102 and 104 may be comprised of polysilicon, or may be comprised of a metal, such as tungsten, as part of a replacement metal gate (RMG) process. Although one fin is shown in FIG. 1, other embodiments of the present invention may utilize multiple fins per transistor.

FIGS. 2A and 2B show views of a semiconductor structure 200 at a starting point for embodiments of the present invention. FIG. 2A is a "gate cut" cross section, as viewed along line A-A' of FIG. 1. FIG. 2B is a "fin cut" cross section, as viewed along line B-B' of FIG. 1. Referring now to FIG. 2A, there is shown a first gate 202 and a second gate 204. As stated previously, similar elements may be referred to by similar numbers in various figures (FIGs) of the drawing, in which case typically the last two significant digits may be the same. For example, gate 202 of FIG. 2 is similar to gate 102 of FIG. 1. Disposed below the gates is fin 206. Fin 206 has an epitaxial region 210 formed on it in the region between gates 202 and 204. In embodiments, the epitaxial region 210 may be used as a stressor region to induce stresses in the finFET to enhance carrier mobility. In the case of a P-type finFET, the epitaxial region 210 may comprise silicon germanium (SiGe). In some embodiments, the epitaxial region 210 may comprise a silicon region. A nitride cap layer 208 is formed over each gate, and spacers 214 are formed on the sides of each gate. The spacers 214 may also be comprised of a nitride, such as silicon nitride. A contact etch stop layer (CESL) 216 is deposited over the structure, and is in direct physical contact with epitaxial region 210. The CESL 216 serves to provide a controllable etch stop point, to help ensure uniformity in the etching that occurs at various phases of the semiconductor fabrication process. In embodiments, the CESL is comprised of a conformal silicon nitride. In embodiments, the CESL has a thickness T1 ranging from about 5 nanometers to about 10 nanometers. A blanket oxide layer 212 is deposited over the semiconductor structure. In embodiments, the blanket oxide layer 212 is deposited using a chemical vapor deposition (CVD) process. Referring now to FIG. 2B, which shows the fin cut, it is shown that the epitaxial region 210 is disposed on the top of the fin 206 and is in a diamond shape. The diamond shape is a result of the growth along crystal planes. The epitaxial region 210 is vulnerable to damage, known as gouging, during the contact formation process. The gouging can be caused by overetching, and it can create problems with contact formation, such as increased contact resistance which reduces device performance. It is therefore desirable to preserve as much of the epitaxial region 210 as possible in the process of contact formation.

FIGS. 3A and 3B show views of a semiconductor structure 300 after a subsequent process step of performing a first anisotropic etch. FIG. 3A is a "gate cut" cross section, as viewed along line A-A' of FIG. 1. FIG. 3B is a "fin cut" cross section, as viewed along line B-B' of FIG. 1. In embodiments, the anisotropic etch is a reactive ion etch (RIE) that is selective such that it etches oxide at a much faster rate than for nitride. As a result, a cavity 318 is formed in the blanket oxide layer 312, having a width W1. In embodiments, the width W1 is about the same width as the epitaxial region 310. In embodiments, the width W1 may range from about 15 nanometers to about 30 nanometers. As a result of the first anisotropic etch, a portion 316B of the CESL 316 is exposed at the base of the cavity 318.

FIGS. 4A and 4B show views of a semiconductor structure 400 after a subsequent process step of performing a first isotropic etch. FIG. 4A is a "gate cut" cross section, as viewed along line A-A' of FIG. 1. FIG. 4B is a "fin cut" cross section, as viewed along line B-B' of FIG. 1. In embodiments, the isotropic etch may be a SiCoNi etch. A SiCoNi etch is a remote plasma assisted dry etch process which involves the simultaneous exposure of a substrate to $H_2$, NF3 and NH3 plasma by-products. Remote plasma excitation of the hydrogen and fluorine species allows plasma-damage-free substrate processing. The SiCoNi etch is largely conformal and selective towards silicon oxide layers but does not readily etch silicon regardless of whether the silicon is amorphous, crystalline, or polycrystalline. In other embodiments, a chemical oxide removal (COR) process may be used. The isotropic etch is selective such that it etches oxide at a much faster rate than for nitride. As a result, a cavity 418 is widened to have a width W2. where W2>W1. In embodiments, the width W2 may range from about 18 nanometers to about 35 nanometers. Referring specifically to FIG. 4A, the first isotropic etch exposes sidewall portion 416S of the CESL 416. Referring specifically to FIG. 4B, as a result of the first isotropic etch, the CESL 416 is exposed on the upper portion of epitaxial region 410, which is the portion of region 410 that is above vertex 413 of the diamond-shaped epitaxial region 410.

FIGS. 5A and 5B show views of a semiconductor structure 500 after a subsequent process step of depositing a conformal oxide layer 520. FIG. 5A is a "gate cut" cross section, as viewed along line A-A' of FIG. 1. FIG. 5B is a "fin cut" cross section, as viewed along line B-B' of FIG. 1. In embodiments, the conformal oxide layer 520 is deposited via a chemical vapor deposition process. In embodiments, the conformal oxide layer 520 may have a thickness ranging from about 5 nanometers to about 10 nanometers.

FIGS. 6A and 6B show views of a semiconductor structure 600 after a subsequent process step of performing a second anisotropic etch. FIG. 6A is a "gate cut" cross section, as viewed along line A-A' of FIG. 1. FIG. 6B is a "fin cut" cross section, as viewed along line B-B' of FIG. 1. In embodiments, the second anisotropic etch is a reactive ion etch (RIE) that is selective such that it etches oxide at a much faster rate than for nitride. Referring specifically to FIG. 6B, as a result of the second anisotropic etch, the CESL 616 is once again exposed on the upper portion of epitaxial region 610, which is the portion of region 610 that is above vertex 613 of the diamond-shaped epitaxial region 610. Referring specifically to FIG. 6A, the bottom portion 616B of CESL 616 is exposed, whereas the sidewall portion 616S of the CESL is not exposed, and is covered by the conformal oxide layer 620.

FIGS. 7A and 7B show views of a semiconductor structure 700 after a subsequent process step of performing a nitride to oxide conversion. In embodiments, the nitride to oxide conversion is performed using a microwave-based oxidation process. In other embodiments, a thermal oxidation process may be used. As a result of the nitride to oxide conversion, a portion of the CESL layer 716 is converted to an oxide region 722. Referring specifically to FIG. 7A, the sidewall portion 716S of the CESL layer remains as nitride, while the bottom portion is converted to an oxide region 722. In embodiments, the nitride to oxide conversion may be performed by a microwave-based oxidation process at a process temperature ranging from about 25 degrees Celsius to about 650 degrees Celsius. In embodiments, the nitride to oxide conversion may be performed by a microwave-based oxidation process for a duration ranging from about 50 seconds to about 160 seconds.

FIGS. 8A and 8B show views of a semiconductor structure 800 after a subsequent process step of performing a second isotropic etch. In embodiments, the second anisotropic etch is a reactive ion etch (RIE) that is selective such that it etches oxide at a much faster rate than for nitride. As a result of the second isotropic etch, the top surface 824 of the epitaxial region 810 is exposed. Referring specifically to FIG. 8A, the sidewall portion 816S of the CESL is intact, but the CESL is removed at the bottom to expose top surface 824 of the epitaxial region 810. A portion of the conformal oxide region 720 (FIG. 7A/7B) is removed from the interior of cavity 818.

FIGS. 9A and 9B show views of a semiconductor structure 900 after a subsequent process step of depositing a fill metal 926 to serve as the contact. In embodiments, the fill metal 926 may comprise tungsten. The fill metal 926 is in direct physical contact with the top surface 924 of the upper portion of epitaxial region 910, which is the portion of region 910 that is above vertex 913, and is also in contact with the sidewall portion 916S of the CESL. Due to the process steps of embodiments of the present invention, the epitaxial region 910 is protected prior to the deposition of the fill metal 926, and gouging of the epitaxial region 910 is minimized.

FIG. 10 shows a top-down view of a semiconductor structure 1000 in accordance with embodiments of the present invention after a subsequent process step of performing a fin cut. At a subsequent process step, a fin cut process may be used to separate the fin (106 of FIG. 1) into two separate fins (1006A and 1006B) to form separate finFET devices.

FIG. 11 is a flowchart 1100 indicating process steps for embodiments of the present invention. In process step 1150, a fin is formed. In embodiments, this may be performed using a sidewall image transfer (SIT) process. In process step 1152, a diamond-shaped epitaxial region is formed on the fins. The epitaxial region may be formed using a selective epitaxial growth (SEG) process. In process step 1154, a contact etch stop layer (CESL) is deposited. In embodiments, the CESL may be comprised of silicon nitride. In process step 1156, a blanket oxide layer is deposited on the semiconductor structure. In embodiments, this is performed using a chemical vapor deposition (CVD) process. In process step 1158, a first anisotropic etch is performed. This may be a selective reactive ion etch. In process step 1160, a first isotropic etch is performed. In embodiments, this includes a SiCoNi etch, or a chemical oxide removal (COR) process. In process step 1162, a conformal oxide is deposited. This may include a silicon oxide layer, and may be deposited by a chemical vapor deposition process. In process step 1164, a second anisotropic etch is performed. This may be a selective reactive ion etch. In process step 1166, a nitride to oxide conversion process is performed. This may be performed using a microwave-based oxidation process. As a result of process step 1166, a portion of the CESL deposited in process step 1154 is converted from nitride to oxide, such that it may be selectively removed. In process step 1168, a second isotropic etch is performed. In embodiments, this includes a SiCoNi etch, or a chemical oxide removal (COR) process. As a result of process step 1168, the oxide-converted portions of the CESL are removed. In process step 1170, a fill metal, such as tungsten, is deposited in the cavity to form the contact. From this point forward, industry-standard processes may be used to complete the fabrication of the integrated circuit. This may include formation of additional dielectric layers, via layers, and metallization layers, as well as packaging processes.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A semiconductor structure, comprising:
    a semiconductor substrate;
    a semiconductor fin disposed on the semiconductor substrate;
    an epitaxial region disposed on the semiconductor fin;
    a blanket oxide layer disposed on the semiconductor fin and the epitaxial region;
    a cavity in the blanket oxide layer, wherein at least one sidewall of the cavity comprises a contact etch stop layer, a width of the cavity is about a width of the epitaxial region plus twice a thickness of the contact etch stop layer, and a floor of the cavity comprises a top surface of the epitaxial region; and
    a fill metal disposed in the cavity, wherein the fill metal is in direct physical contact with the top surface of the epitaxial region.

2. The semiconductor structure of claim 1, wherein the semiconductor substrate is selected from the group consisting of bulk silicon and silicon-on-insulator (SOI).

3. The semiconductor structure of claim 1, wherein the epitaxial region comprises at least one of silicon germanium and silicon.

4. The semiconductor structure of claim 1, wherein the thickness of the contact etch stop layer is from about 5 nanometers to about 10 nanometers.

5. The semiconductor structure of claim 1, wherein the fill metal comprises tungsten.

6. The semiconductor structure of claim 1, further comprising a plurality of gates disposed over the semiconductor fin, and a nitride cap layer disposed on each gate of the plurality of gates.

7. A semiconductor structure, comprising:
    a semiconductor substrate;
    a semiconductor fin disposed on the semiconductor substrate;
    an epitaxial region disposed on the semiconductor fin;
    a blanket oxide layer disposed on the semiconductor fin and the epitaxial region;
    a cavity in the blanket oxide layer, wherein at least one sidewall of the cavity comprises a nitride contact etch stop layer, a width of the cavity is about a width of the epitaxial region plus twice a thickness of the nitride contact etch stop layer, and a floor of the cavity comprises a top surface of the epitaxial region; and
    a fill metal disposed in the cavity, wherein the fill metal is in direct physical contact with the top surface of the epitaxial region.

8. The semiconductor structure of claim 7, wherein the semiconductor substrate is selected from the group consisting of bulk silicon and silicon-on-insulator (SOI).

9. The semiconductor structure of claim 7, wherein the epitaxial region comprises at least one of silicon germanium and silicon.

10. The semiconductor structure of claim 7, wherein the nitride contact etch stop layer comprises a conformal silicon nitride.

11. The semiconductor structure of claim 7, wherein the thickness of the nitride contact etch stop layer is from about 5 nanometers to about 10 nanometers.

12. The semiconductor structure of claim 7, wherein the fill metal comprises tungsten.

13. A semiconductor structure, comprising:
    a semiconductor substrate;
    a semiconductor fin disposed on the semiconductor substrate;
    an epitaxial region disposed on the semiconductor fin;
    a blanket oxide layer disposed on the semiconductor fin and the epitaxial region;
    a cavity in the blanket oxide layer, wherein at least one sidewall of the cavity comprises a nitride contact etch stop layer, a width of the cavity is about a width of the epitaxial region plus twice a thickness of the nitride contact etch stop layer, and a floor of the cavity comprises a top surface of the epitaxial region;
    a fill metal disposed in the cavity, wherein the fill metal is in direct physical contact with the top surface of the epitaxial region;
    a plurality of gates disposed over the semiconductor fin; and
    a nitride cap layer disposed on each gate of the plurality of gates.

14. The semiconductor structure of claim 13, wherein the semiconductor substrate is selected from the group consisting of bulk silicon and silicon-on-insulator (SOI).

15. The semiconductor structure of claim 13, wherein the epitaxial region comprises at least one of silicon germanium and silicon.

16. The semiconductor structure of claim 13, wherein the nitride contact etch stop layer comprises a conformal silicon nitride.

17. The semiconductor structure of claim 13, wherein the thickness of the nitride contact etch stop layer is from about 5 nanometers to about 10 nanometers.

18. The semiconductor structure of claim 13, wherein the fill metal comprises tungsten.

* * * * *